(12) United States Patent
Lee et al.

(10) Patent No.: US 10,777,665 B2
(45) Date of Patent: Sep. 15, 2020

(54) III-V AND ZN BASED FINFET STRUCTURE FORMED USING LOW TEMPERATURE DEPOSITION TECHNIQUES

(71) Applicant: International Business Machines Corporation, Armonk, NY (US)

(72) Inventors: Yun Seog Lee, Seoul (KR); Devendra Sadana, Pleasantville, NY (US); Joel P. De Souza, Putnam Valley, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/543,365

(22) Filed: Aug. 16, 2019

(65) Prior Publication Data

US 2019/0371921 A1    Dec. 5, 2019

Related U.S. Application Data (62) Division of application No. 15/957,993, filed on Apr. 20, 2018, now Pat. No. 10,431,672.

(51) Int. Cl.
| | |
|---|---|
| *H01L 29/66* | (2006.01) |
| *H01L 21/02* | (2006.01) |
| *H01L 21/8234* | (2006.01) |
| *H01L 29/78* | (2006.01) |

(52) U.S. Cl.
CPC .... *H01L 29/66795* (2013.01); *H01L 21/0228* (2013.01); *H01L 21/823431* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 5,268,815 | A | 12/1993 | Cipolla et al. |
| 6,656,389 | B2 | 12/2003 | Iruvanti et al. |
| 7,189,992 | B2 | 3/2007 | Wager, III et al. |
| 7,339,187 | B2 | 3/2008 | Wager, III et al. |
| 7,824,972 | B2 | 11/2010 | Choung et al. |
| 7,888,207 | B2 | 2/2011 | Wager, III et al. |
| 9,601,482 | B1 | 3/2017 | Fogel et al. |
| 9,646,883 | B2 | 5/2017 | Brink et al. |
| 2003/0218221 | A1 | 11/2003 | Wager et al. |

(Continued)

FOREIGN PATENT DOCUMENTS

| | | |
|---|---|---|
| CN | 103314435 A | 9/2013 |
| EP | 0004555 A2 | 10/1979 |

OTHER PUBLICATIONS

Sn doped ZnO thin film transistor with AZO, TZO and Al heterojunction source-drain contacts. Electronics Letters Feb. 18, 2016 vol. 52 No. 4 pp. 302-304.

(Continued)

*Primary Examiner* — Evren Seven
(74) *Attorney, Agent, or Firm* — Patterson + Sheridan, LLP (57) ABSTRACT

Aspects of the present disclosure include a semiconductor structure comprising a gate layer with an associated gate dielectric thereon, and a region comprising at least one fin structure in contact with the gate layer, wherein the fin structure includes at least two distinct materials, and wherein one of the two distinct materials is a Zn based material.

19 Claims, 5 Drawing Sheets

(56) References Cited

U.S. PATENT DOCUMENTS

| | | | |
|---|---|---|---|
| 2003/0218222 A1 | 11/2003 | Wager et al. | |
| 2007/0141784 A1 | 6/2007 | Wager et al. | |
| 2008/0108198 A1 | 5/2008 | Wager et al. | |
| 2012/0190216 A1 | 7/2012 | Chan et al. | |
| 2013/0001573 A1 | 1/2013 | Lee et al. | |
| 2017/0207126 A1 | 7/2017 | Ching et al. | |
| 2018/0261498 A1* | 9/2018 | Gardner | H01L 21/762 |
| 2019/0273087 A1* | 9/2019 | Morris | G11C 11/22 |
| 2019/0296081 A1* | 9/2019 | Sharma | H01L 49/003 |
| 2019/0305121 A1* | 10/2019 | Sharma | H01L 29/78684 |
| 2019/0305138 A1* | 10/2019 | Sharma | H01L 29/78681 |

OTHER PUBLICATIONS

A Back-Channel-Etched Amorphous InGaZnO Thin-Film Transistor Technology With Al-Doped ZnO as Source/Drain and Pixel Electrodes IEEE Transactions on Electron Devices, vol. 63, No. 5, May 2016 2205-2209.

U.S. Appl. No. 15/957,993 "Method of Forming A III-V and Zn Based Finfet Structure Using Low Temperature Deposition Techniques," filed Apr. 20, 2018.

IBM, "List of IBM Patents or Patent Applications Treated As Related," for U.S. Appl. No. 16/543,365, filed Aug. 16, 2019.

* cited by examiner

III-V AND ZN BASED FINFET STRUCTURE FORMED USING LOW TEMPERATURE DEPOSITION TECHNIQUES

CROSS-REFERENCE TO RELATED APPLICATIONS

This application is a divisional of co-pending U.S. patent application Ser. No. 15/957,993, filed Apr. 20, 2018. The aforementioned related patent application is herein incorporated by reference in its entirety.

BACKGROUND

The present disclosure relates to a semiconductor structure and a method of forming the same. More particularly, the present disclosure relates to employing low temperature deposition techniques to develop a field effect transistor (FET) device.

The dimensions of semiconductor FETs have steadily shrunk as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

One aspect of the present disclosure includes a structure, where the structure includes: a gate layer with an associated gate dielectric thereon; at least one fin structure, in contact with the gate dielectric, where the fin structure includes at least two distinct materials, and wherein one of the two distinct materials is a Zn based material.

Another aspect of the present disclosure includes a gate structure comprising a gate dielectric in contact with a III-V fin structure, a spacer material over the gate structure and the fin structure, wherein the spacer material forms at least one sidewall spacer in contact with the gate, wherein a portion of the fin structure creates an opening between at least two portions of the spacer material, and wherein the spacer material, the fin structure, and the gate structure include a Zn based material.

DETAILED DESCRIPTION

It should be understood that material compounds will be described in terms of listed elements, e.g., InP, InGaAs, ZnO, etc. These compounds may include different proportions of the elements within the compound, e.g., InGaAs includes $In_xGa_{1-x}As$, where x is less than or equal to 1 etc. In addition, other elements may be included in the compound, such as, e.g., Al-doped ZnO (AZO), and still function in accordance with the present principles. The compounds with additional elements will be referred to herein as alloys. Furthermore, although embodiments of the present disclosure discuss Zn based deposition material layers in relation to InGaAs fin structures, it is possible to change the material composition to include different materials, provided the channel material, e.g. InGaAs, has a compatible band gap aligned to a material suitable for low temperature deposition, e.g. ZnO. The same applies with respect to any discussion as it relates to a passivation layer, e.g. $Al_2O_3$ in relation to selected fin materials composition, e.g. InGaAs, and deposition material layers, e.g. ZnO. Thus, the fin or channel material can be any III-V material, not just InGaAs provided that the band gap of deposition material is matched in relation thereto. In fact, type II-IV materials can be used for fin and channel regions and in accordance with the techniques of the present disclosure.

In accordance with the present principles and for one or more embodiments, electronic devices, structures and methods for formation are described for ZnO, or ZnO in conjunction with an Al based material, e.g. AZO, with III-V semiconductor fin structures. Aspects of the present disclosure include embodiments for forming a structure utilizing low-temperature deposition techniques, such as atomic layer deposition (ALD) techniques to remedy adverse effects caused by small band gaps and high defect densities associated with certain FET structures that include III-V materials, e.g. InGaAs, and also result in leakage current as a result of the same. Epitaxial growth techniques for forming these structures requires high temperatures, which causes an increase in defects and defect density. Accordingly, employing materials suitable for forming a FET structure with low temperature techniques, and applying low temperature techniques to suitable base structures for forming a FinFET device, including a FinFET structure with a fin structure including one or more III-V structures is desirable.

As stated, certain embodiments improve performance and address the drawbacks of conventional structures, e.g. the present disclosure provides techniques for using low-temperature deposition techniques to form various material layers and fin structure for a FinFET device. Use of low temperature deposition techniques, e.g., minimize structural defects and impurities that are associated with use of higher temperature deposition techniques, e.g. high temperature chemical-vapor deposition (CVD), physical vapor deposition (PVD), etc. In a particular embodiment, ZnO is used in conjunction with InGaAs, as the two materials are sufficiently band-gap matched to further enhance operability and functionality of a final structure developed pursuant to at least one of the techniques described herein.

It should also be understood that material compounds will be described in terms of listed elements, e.g., InP, InGaAs, ZnO, etc. These compounds may include different proportions of the elements within the compound, e.g., InGaAs includes $In_xGa_{1-x}As$, where x is less than or equal to 1, etc. In addition, other elements may be included in the compound, such as, e.g., AZO and still function in accordance with the present principles. The compounds with additional elements will be referred to herein as alloys. Furthermore, although embodiments of the present disclosure discuss Zn based deposition material layers in relation to InGaAs fin structures, it is possible to change the material composition to include different materials, provided the channel material, e.g. InGaAs, has a compatible band gap with a material suitable for low temperature deposition, e.g. ZnO. The same applies with respect to any discussion as it relates to a passivation layer, e.g. $Al_2O_3$ in relation to selected fin materials composition, e.g. InGaAs, and deposition material layers, e.g. ZnO. Thus, the fin or channel material can be any III-V material, not just InGaAs provided that the deposition material is band gaped matched in relation thereto. In fact, type II-IV materials can be used for fin and channel regions and in accordance with the techniques of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, may be purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
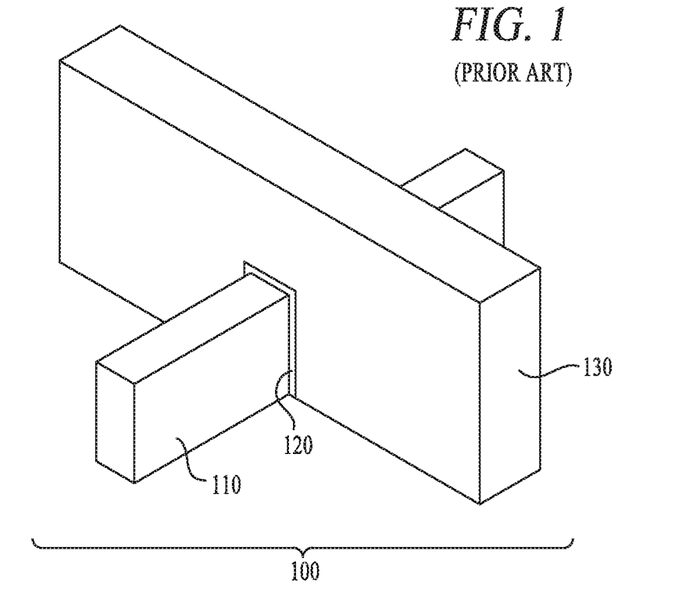
FIG. 1 illustrates a FET structure that can be used in accordance with or more techniques and applications of at least one embodiment of the present disclosure.

FIG. 1 illustrates a FinFet configuration or structure 100 that includes an InGaAs FinFet structure. The structure includes one or more InGaAs fins 110, a gate dielectric layer 120, and a gate 130 (gate 130 can also be referred to as gate layer 130 herein) that is suitable for depositing one or more conformal layers there over (see below) in accordance with one or more techniques as discussed herein. The one or more InGaAs fins 110 can form the basis for a channel region of the structure 100. In an exemplary embodiment, the gate dielectric layer 120 may be composed of a high-k dielectric material which may have a relative dielectric constant greater than four such as $HfO_2$. For example, $ZrO_2$, $Al_2O_3$, $TiO_2$, $LaAlO_3$, $HfSiO_2$, $SrTiO_3$, $Y_2O_3$ may be used as the gate dielectric material in the layer 120. In one embodiment, the gate dielectric layer 120 has a thickness in the range of 1 nm to 20 nm. In an embodiment, high-k dielectrics are used for the gate dielectric layer with III-V semiconductors channel. The gate 130 can include a metal or metal compound, such as Cu, Al, W, TiN, or alloys thereof or a suitable semiconductor material.

Figure 2:
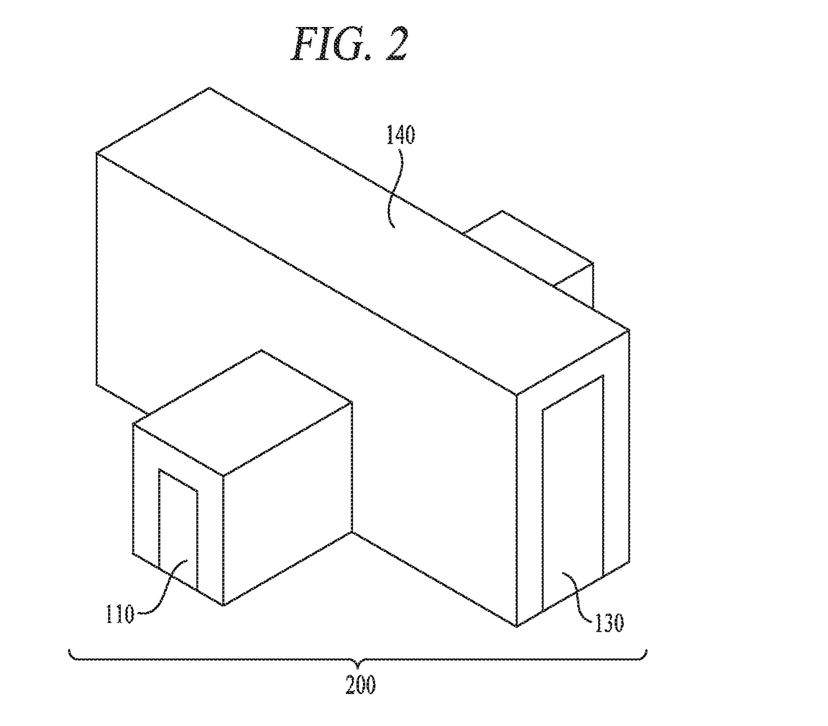
FIG. 2 illustrates a deposition process in accordance with one or more embodiments of the present disclosure.

FIG. 2 illustrates the structure 100 of FIG. 1 after a conformal material layer 140 is deposited there-over, and forming structure 200. The conformal material layer 140 can be deposited using any suitable technique that enables a conformal deposition in relation to the device 100, including atomic layer deposition (ALD), chemical vapor deposition (CVD), or low temperature thermal oxide (LTO). In one embodiment, the material should be selected such that it is suitable to have a relatively uniform topography when applied over the structure 100 and also suitable for an ALD or LTO deposition. The conformal material layer 140 can be an oxide material layer, where in one embodiment it is $SiO_2$.

Figure 3:
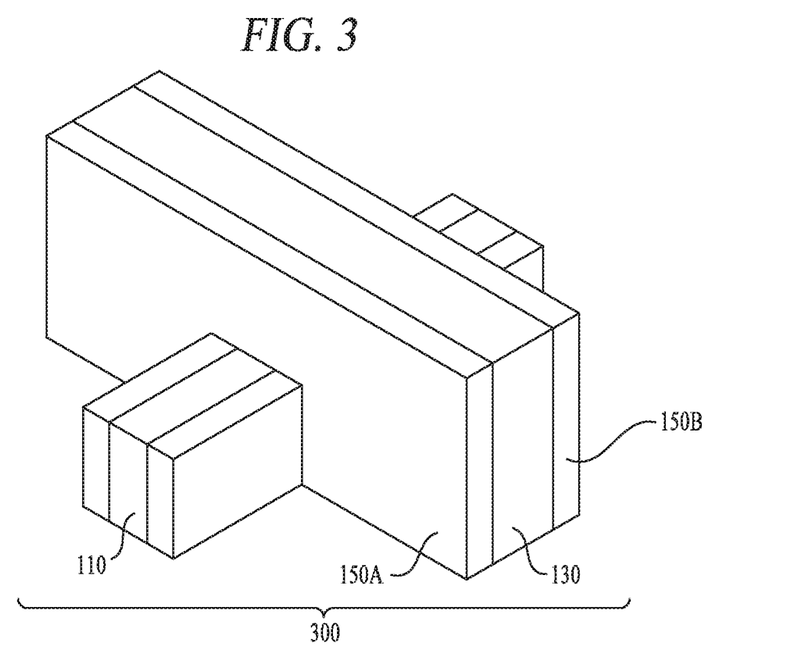
FIG. 3 illustrates an etch process in accordance with one or embodiments of the present disclosure.

FIG. 3 illustrates the structure 200 of FIG. 2 after an anisotropic etch process, for example, an anisotropic wet etch or ME, is applied to partially remove the conformal material layer 140, which creates structure 300. The ME process of structure 300 includes the creation of sidewall spacers 150A, 150B, etc., while also keeping the conformal material layer 140 in contact with the walls of the gate 130.

Figure 4:
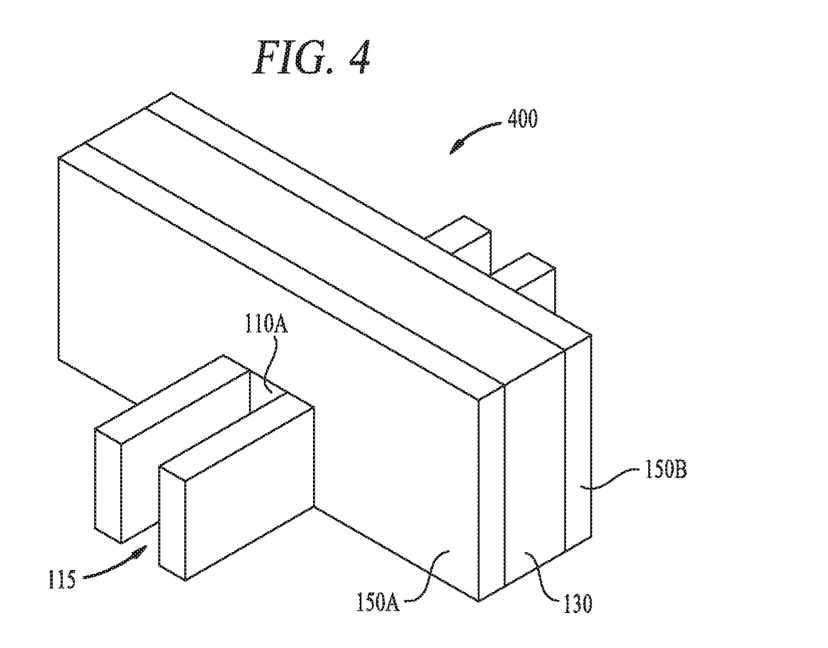
FIG. 4 illustrates an etch process in accordance with one or more embodiments of the present disclosure.

FIG. 4 illustrates a structure 400 where a portion of the one or more InGaAs fins 110 is removed using a chlorine, a fluorine, or a bromine based RIE etch chemistry. As stated above, the one or more fins 110 can be selected or developed to include or consist of one or more other III-V materials, not merely InGaAs, and as stated, type II-IV materials can be employed provided that a suitable RIE etch chemistry would, in relation thereto, also be selected to successfully remove the desired portion of the one or more fins 110. The same principle, as stated, would apply with respect to any other RIE and/or low temperature deposition step described in the present disclosure. In one embodiment, the etch technique applied to the one or more III-V material fins 110, e.g. InGaAs fins, will result in an opening 115 where the deposited conformal material portion 140A associated with the one or more fins 110 extends beyond the recessed or remaining one or more fin structure 110A.

Figure 5:
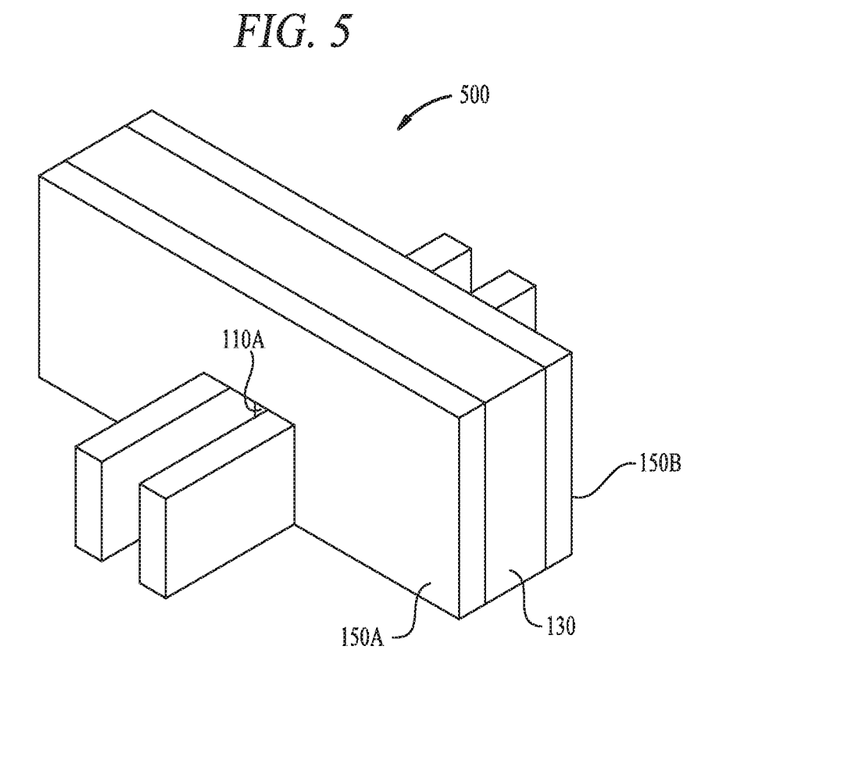
FIG. 5 illustrates a recessing process in accordance with one or more embodiments of the present disclosure.

FIG. 5 illustrates performing a two-step oxidation and etch step on the remaining fin structure 110A and forming structure 500. In one embodiment, a digital wet chemical etch process involving a two-step process capable of nanometer-level control may be used to directionally remove damaged portions of the remaining fin structure 110A. The first step of this process may involve oxidizing portions of the remaining fin structure 110A, followed by a second step that may involve removal of oxidized material using a suitable acid. This two-step process may be repeated to achieve the desired etch results. Since, in one embodiment, the oxidation is diffusion-limited, it may be relatively process independent, enabling a high-precision process that permits removal of a single monolayer at a time. In one embodiment, this process enables deposition of a passivation layer (discussed below) that can have a thickness as low as 1 nm. In the embodiment where the remaining fin structure 110A is an InGaAs fin structure 110A, the oxidation agent can be hydrogen peroxide (H2O2) and the acid used for the etch can be hydrofluoric acid (HF) or other suitable material.

Figure 6A:
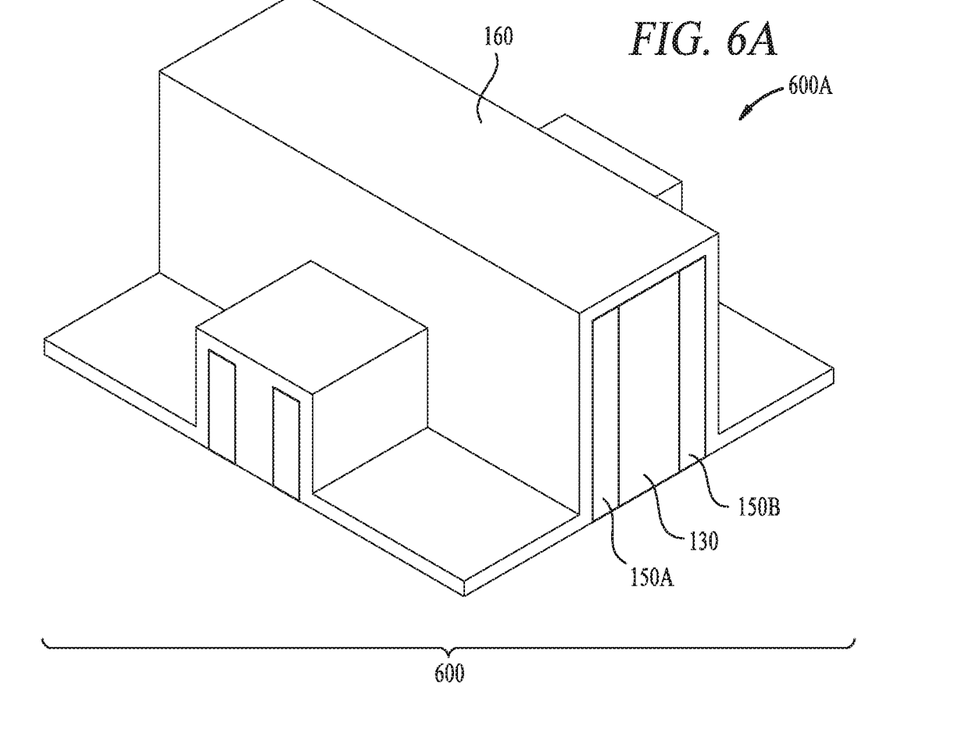
FIG. 6A illustrates a deposition process in accordance with one or more embodiments of the present disclosure.

FIG. 6A illustrates the structure 500 of FIG. 5 after a ZnO layer, or other suitable low-temperature deposition layer 160, is deposited over the entire structure 500 to form the structure 600. In an embodiment where a p-doped III-V material is used for the one or more fins, e.g. p-doped InGaAs, an n-doped ZnO material 160 is deposited over the structure 500 to form the structure 600. In one embodiment, the range of n-dopant in ZnO is up to 2 atomic percent (e.g., ~5×1021 cm-3). ZnO dopants may include Al, Ga, In, etc., with AZO being used in one embodiment. ZnO may be deposited or grown by ALD or an LTO process.

Figure 6B:
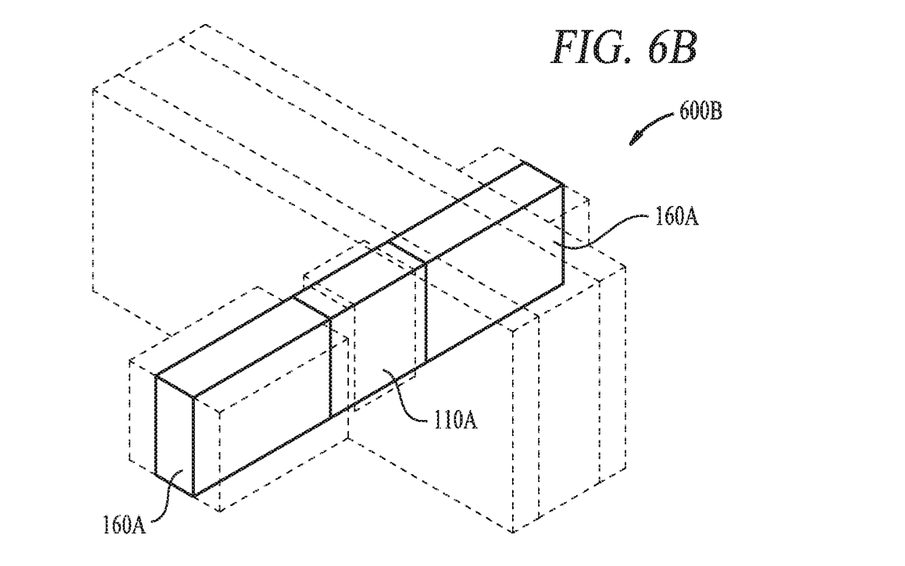
FIG. 6B illustrates a deposition process in accordance with one or more embodiments of the present disclosure.

According to one embodiment, as illustrated in FIG. 6B, the ZnO preferably includes aluminum doped zinc oxide, e.g n+ZnO:Al (AZO) deposited by atomic layer deposition ALD. The ALD process forms structure 600B, which includes a new fin structure that includes 160 and rebuilds the source drain region, e.g. where 160A includes the respective source and drain of the device, where the one or more fin structures 160 include an AZO source and drain 160A connected to what remains from the recessed InGaAs fin 110A, and where in one embodiment this forms a heterojunction between the two materials, e.g. 110A and 160A. In one example, the ALD process may include the use of a 13 cycle Zn deposition to 1 cycle Al deposition. The carrier concentration (electron density) of the source/drain region(s) may be between about 3×1020 cm-3 to about 5×1021 cm-3, and preferably about 3.0×1021 cm-3 for Aluminum-doped Zinc Oxide (AZO). The high band gap energy of AZO also assists in reducing current leakage. In one embodiment, ALD deposition employed for growing the ZnO layer 160, e.g. AZO layer 160, can be conducted at a temperature of approximately 185 degrees C.

FIG. 6B further illustrates an embodiment where, prior to depositing layer 160', a passivation layer 170 is deposited at an interface between the remaining fin structure 110A and the area where the deposition of the ZnO layer 160 will take place. The passivation layer can be an aluminum oxide layer (Al2O3) deposited at the interface by an ALD process. In one embodiment, the ALD process is conducted at a temperature of approximately 250 degrees C. In one embodiment, where an AZO layer is the desired material for layer 160, the Al of the passivation layer 160 can be employed to dope the ZnO layer 160, where the doping can be increased by annealing, e.g., at 400-450 degrees C. in an inert gas environment such as Ar, N2, H2, etc.

Figure 7A:
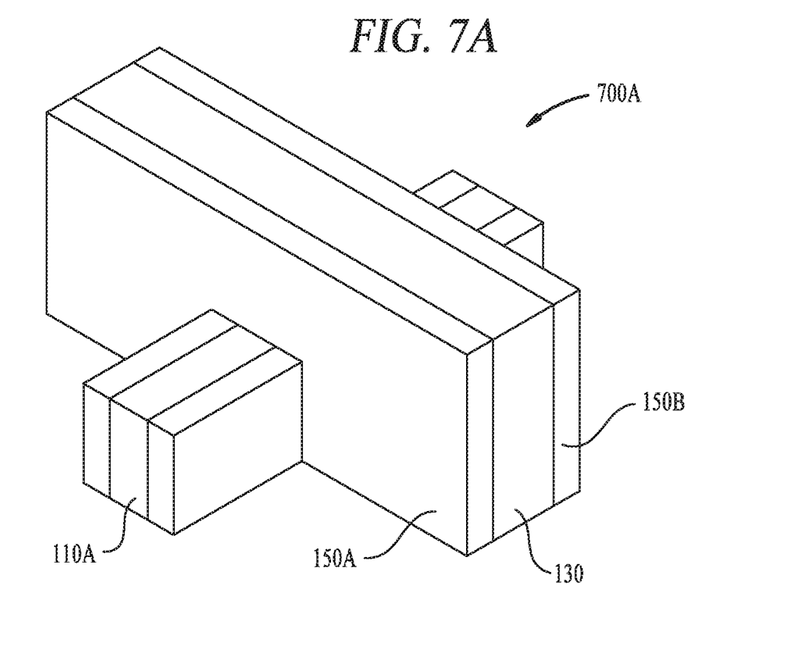
FIG. 7A illustrates a recessing process in accordance with one or more embodiments of the present disclosure.
Figure 7B:
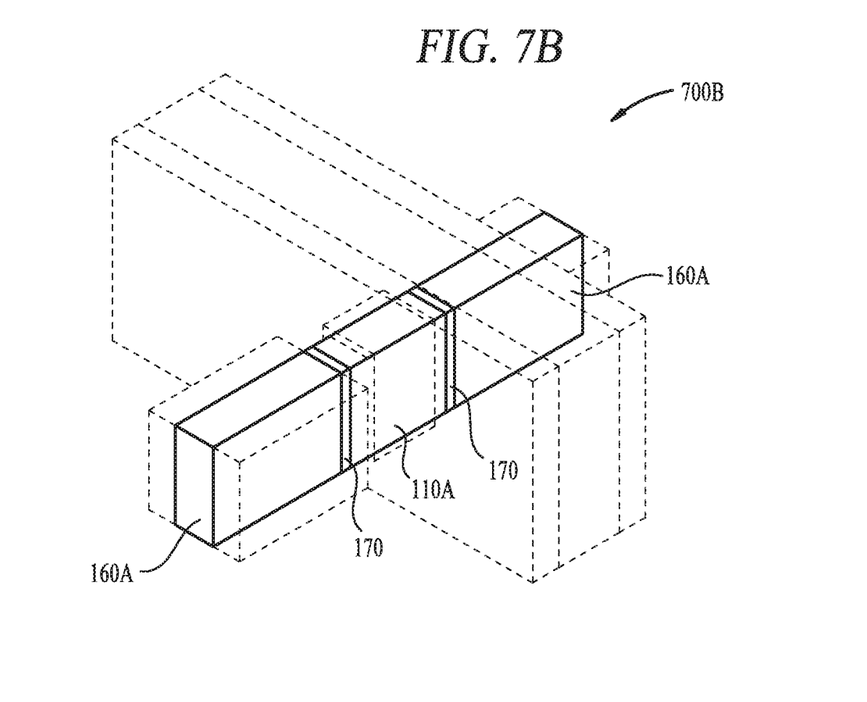
FIG. 7B illustrates a recessing process in accordance with one or more embodiments of the present disclosure.

FIG. 7A and FIG. 7B illustrates an embodiment where, outside of a channel or fin structure area 160A, the deposited material layer 160' is removed by an appropriate anisotropic etch technique, such as RIE employing a chemistry selective to the deposited material layer 160'. In the instance where the deposited material layer 160' is a Zn based layer, such as ZnO and/or more particularly AZO, then the etch chemistry can be a chlorine based or bromine based etch chemistry. The resulting structure illustrated in FIG. 7A is a structure 700 where at least one fin structure 160 of a new Zn based material fin is created. In one embodiment, both sides of fin structure 160 include a AZO portions 160A e.g., respective source and drain regions, which are connected to a remaining portion of a III-V material, e.g. InGaAs, that also forms a portion of the structure 160. In one embodiment, as shown in FIG. 7B, the structure 700 can include the passivation layer 170 as described with respect to FIG. 6B, resulting in structure 700B.

The structures of the present disclosure, e.g. 600, can be on any suitable semiconductor substrate (not shown). The semiconductor substrate can be a bulk silicon (Si) III-V based substrate, or an insulator supporting layer that in turn can be disposed upon an underlying substrate layer. Thus in some embodiments a silicon-on-insulator (SOI), a III-V on insulator structure, or other suitable substrate can be employed, while in other embodiments a bulk structure can be employed.

What is claimed is:

1. A semiconductor structure comprising:
a gate layer with an associated gate dielectric; and
a region comprising at least one fin structure in contact with the gate dielectric, wherein the fin structure includes at least two distinct materials, and wherein one of the two distinct materials includes aluminum-doped zinc oxide (AZO) in a non-channel region of the fin structure.

2. The semiconductor structure according to claim 1 further comprising: a passivation layer at an interface between the two distinct materials of the fin structure.

3. The semiconductor structure according to claim 2 further, wherein the second distinct material of the fin structure comprises a Ill-V material.

4. The semiconductor structure according to claim 3, wherein the second distinct material of the fin structure comprises InGaAs.

5. The semiconductor structure according to claim 4, wherein the passivation layer comprises an Al based material.

6. The semiconductor structure according to claim 5, wherein the passivation layer comprises Al2O3.

7. The semiconductor structure according to claim 6 further comprising: at least one nitride spacer material in contact with the gate layer and the fin structure.

8. A semiconductor structure comprising:
a gate structure comprising a gate dielectric in contact with a III-V fin structure; and
a spacer material in contact with the gate structure and the III-V fin structure, wherein the spacer material forms at least one sidewall spacer in contact with the gate, wherein a portion of the III-V fin structure creates an opening between at least two portions of the spacer material, and wherein the spacer material, the III-V fin structure, and the gate structure include a Zn based material.

9. The semiconductor structure of claim 8, wherein the Zn based material forms a dual-material fin structure, wherein the dual material fin structure comprises a portion of the Zn based material and the III-V fin structure.

10. The semiconductor structure of claim 9 further comprising: a passivation layer at an interface of the III-V fin structure and the portion of Zn based material of the dual-material fin structure.

11. The semiconductor structure of claim 10, wherein the passivation layer is an Al2O3 layer.

12. The semiconductor structure of claim 11, wherein the Zn based material is included in an AZO doped layer.

13. The semiconductor structure of claim 12, wherein the Zn based material is ZnO and the III-V fin structure comprises InGaAs.

14. A semiconductor structure comprising:
a gate in contact with a first set of sidewall spacers, wherein the first set of sidewall spacers covers opposite sides of a face of the gate;
a fin structure in contact with the gate and the first set of sidewall spacers, and in contact with a set of passivation layers, wherein the set of passivation layers covers opposite sides of a face of the fin structure;
a source in contact with a passivation layer from the set of passivation layers, and in contact with a second set of sidewall spacers, wherein the second set of sidewall spacers covers opposite sides of a face of the source and is in contact with a sidewall spacer from the first set of sidewall spacers; and
a drain in contact with a passivation layer from the set of passivation layers, and in contact with a third set of sidewall spacers, wherein the third set of sidewall spacers covers opposite sides of a face of the drain and is in contact with a sidewall spacer from the first set of sidewall spacers.

15. The structure according to claim 14, wherein the fin structure comprises InGaAs.

16. The semiconductor structure according to claim 14, wherein the set of passivation layers includes at least one passivation layer comprising an aluminum based material.

17. The semiconductor structure according to claim 16, wherein the set of passivation layers includes at least one passivation layer comprising aluminum oxide (Al2O3).

18. The semiconductor structure according to claim 14, wherein the source comprises aluminum-doped zinc oxide (AZO).

19. The structure according to claim 14, wherein the drain comprises aluminum-doped zinc oxide (AZO).

* * * * *